United States Patent
Grunwald

(10) Patent No.: US 6,998,066 B2
(45) Date of Patent: Feb. 14, 2006

(54) CMP COMPOSITION CONTAINING ORGANIC NITRO COMPOUNDS

(75) Inventor: John Grunwald, Tel Aviv (IL)

(73) Assignee: J.G. Systems, Inc., Miami, FL (US)

( * ) Notice: Subject to any disclaimer, the term of this patent is extended or adjusted under 35 U.S.C. 154(b) by 147 days.

(21) Appl. No.: 10/430,910

(22) Filed: May 7, 2003

(65) Prior Publication Data

US 2004/0173574 A1    Sep. 9, 2004

(30) Foreign Application Priority Data

Mar. 6, 2003    (IL) .................................... 154782

(51) Int. Cl.
*C09K 13/00*    (2006.01)
*C09K 13/06*    (2006.01)
*H01L 21/302*   (2006.01)

(52) U.S. Cl. .................... 252/79.1; 252/79.4; 438/692

(58) Field of Classification Search ............. 252/79.1, 252/79.4; 438/692
See application file for complete search history.

(56) References Cited

U.S. PATENT DOCUMENTS 5,403,721 A * 4/1995 Ward et al. .................. 435/34
2002/0016073 A1 * 2/2002 Kondo et al. ................ 438/691

FOREIGN PATENT DOCUMENTS

JP    60032898 A    *    2/1985

OTHER PUBLICATIONS

Central Glass Co Ltd. [CENG], Water-in-oil emulsion detergent composition for machine parts- . . . also nitro:alkane and benzazole derivative, English Abstract of JP 60032898, Aug. 2, 1983, 2 pages.*

* cited by examiner

*Primary Examiner*—Nadine G. Norton
*Assistant Examiner*—Lynette T. Umez-Eronini
(74) *Attorney, Agent, or Firm*—Carmody & Torrance LLP

(57) ABSTRACT

The use of organic nitro compounds, such as nitrobenzene sulfonic acids, in chemical mechanical polishing compositions is disclosed. Chemical mechanical polishing slurries are widely used in polishing and planarizing silicon wafers and other fine surfaces. Inorganic nitro compounds are widely used in these slurries as oxidant sources. However, organic nitro compounds, particularly aromatic nitro compounds, are here suggested as advantageous substitutes.

2 Claims, No Drawings

CMP COMPOSITION CONTAINING ORGANIC NITRO COMPOUNDS

FIELD OF INVENTION

The invention relates to wafer planarizing compositions, known in the industry as CMP, for chemical mechanical polishing.

BACKGROUND OF THE INVENTION

With the growing demand for ever greater miniaturization of ULSI devices, planarization via CMP becomes an increasingly critical aspect in the fabrication sequence of semiconductor devices. The challenge stems from the multitude and differing nature of materials used in the various layers, the demanding geometries and aspect ratios of the structures, the ever present quest for improved yields via reduction of defects, etc.

Patent applications WO 02/083804 to Costas, US 2002/0177316 A1 to Miller and WO 01/44396 A1 to Sachan, are referenced herewith as indicative of methods and compositions of typical CMPs of the prior art. They reflect the differing natures of CMP compositions, dictated by the tasks/problems they need to address, for example nature of the layers, selectivity, surface roughness and throughput.

CMP slurries can be somewhat simplistically described as consisting of abrasive particulate matter suspended in aq, desirably stable compositions. Such susspensions can contain a host of additives, pH adjusters, leveling agents, emulsifiers where needed, and the like. In CMP, the slurry is usually dispensed on a rotating pad in contact with a rotating wafer. Planarization involves a combination of abrasion and chemical reaction at the wafer/slurry interface.

A significant, and generally central component of various metal-polishing slurries, is an oxidizing agent, with hydrogen peroxide and inorganic nitrates appear prevalent. Generally, the oxidizing agent is tailored to suit a given metal to be polished, with copper perhaps being the most challenging. Copper is becoming the metal of choice for interconnect applications, due to its superior electrical conductivity.

While hydrogen peroxide is an attractive oxidizing agent because of reasonable cost, it is not without some serious drawbacks namely poor stability, especially in the presence of transition metals that are known to catalyze decomposition. Another shortcoming of $H_2O_2$ is its less than ideal selectivity. Further, the reaction of peroxides during dissolution of copper, is highly exothermic, making it problematic to maintain temperature stability at the copper/slurry interface, where polishing takes place.

U.S. Pat. No. 6,448,182 to Hall addresses the stability issue through incorporation of stabilizers that are said to reduce, but will not eliminate, decomposition.

The prior art proposes the use of corrosion inhibitors, typically benzotriazoles, as a way to minimize copper oxidation, and improve selectivity. Indeed, benzotriazole is extensively used in the prior art in connection with a host of processes involving copper, taking advantage of its somewhat specific protective, film-forming properties with copper metal, thus serving as a corrosion/oxidation inhibitor for Cu. Its benefit, if any, for metals other than copper, is not indicated.

Some CMP compositions of the prior art are also based on inorganic nitrates. Inorganic nitrates tend to be too aggressive and corrosive, and will not generally favor selectivity, especially for copper.

Further, oxidizing agents of the prior art are somewhat "pH specific", often requiring operation in a rather restricted pH range, resulting in a somewhat narrow operating window. Thus, the prior art appears to necessitate different oxidizers depending on the metal to be polished, often requiring a delicate balancing act when formulating slurries in processes where more than one metal is exposed to the slurry composition.

SUMMARY OF THE INVENTION

The present invention discloses the use of organic nitro derivatives, as oxidizing agents in CMP slurries, as opposed to inorganic nitrates of the prior art. While an embodiment of the patent proposes use of nitro derivatives as the sole oxidizing agent of a given slurry composition, other embodiments envision incorporation of organic nitro derivatives along with other oxidizing agents that may be present in the slurry, for example peroxides, inorganic nitrates, etc.

Thus, the present invention provides, acccording to one of its aspects, a chemical metal polishing (CMP) composition in the form of a slurry and comprising an oxidizer which is an organic nitro compound. In a preferred embodiment the organic nitro compound is an aromatic nitro compound. More preferrably, the aromatic nitro compound is selected from nitrobenzoates, e.g. m-nitrobenzoates, or derivatives thereof and nitrobenzene sulfonic acid, e.g. m-nitrobenzene sulfonic acid, salts or derivatives thereof.

Alternatively, the organic nitro compound is an aliphatic compound. In such case the composition is in the form of an emulsion.

The concentration of the organic nitro compound is in the range of about 1 g/l to about 20 g/l or higher when used as sole oxidizing agent of the composition or in the range of between about 1 to about 2 g/l or less when in the presence of additional oxidizing agents.

According to another aspect, the present invention provides a method for polishing a substrate including at least one conducting or semiconducting layer. The method comprises applying the CMP composition of the invention to the substrate; and removing at least a portion of the conducting or semiconducting layer from the substrate by bringing a pad into contact with the substrate and moving the pad in relation to the substrate.

DETAILED DESCRIPTION OF THE INVENTION

The invention discloses organic nitro compounds in CMP formulations, because of salient advantages they offer, some of which are:

Almost indefinite chemical stability, even in presence of transition metals;

Improved selectivity, with difeferent metals;

Potentially serves as protective film, corrosion inhibitor on a variety of metals, including copper;

Broad pH operating range, extending to both acid and alkaline domains.

In practicing the invention, one can choose from an abundant availability of a host of organic nitro compunds on the market. Indeed, they are extensively used in the manufacture of azo dyes, pharmaceuticals, additives, intermediates, and the like.

In choosing a given organic nitro compound, one will be principally guided by its aqueous solubility in the slurry at a given pH and temperature. Indeed, while some applications will favor highly soluble organic nitro compunds, others may advantageously benefit from its limited solubility, making it an integral part of other abrasive particles in the CMP dispersion. Thus, it can somewhat contribute to abrasion, while acting as a solid oxidation "reservoir" at the wafer/slurry interface, where oxidation will be released in-situ where it is need, and as it is needed.

In a preferred embodiment of the invention, the CMP composition comprises aromatic nitro compounds. More preferably, the aromatic nitro compound is selected from m-nitrobenzoates or derivatives there of and m-nitrobenzene sulfonic acid, salts or derivatives thereof.

Examples of further organic nitro compounds are disclosed in U.S. Pat. No. 2,649,361 to Meyer, U.S. Pat. Nos. 3,203,787 and 3,242,090 to Grunwald. These patents disclose the use of organic nitro compounds for stripping metal coatings from metallic workpieces.

It is known that aromatic nitro compounds will undergo a complex series of intermediate reactions, when they act as oxidizing agents and undergo chemical reduction. Such intermediates are reported to lead to azoxies, diazos, etc. and combinations thereof, often terminating at the end of the reduction process as amines or amine compounds. Also, it is suggested that above intermediates, through their interaction with the metal to be polished, will synergistically reinforce and further promote the polishing and planarizing effect of the slurry. Conceptually, they will serve a dual role of oxidizing agent and protective film former, contributing to selectivity.

While optimal selection of the organic nitro compound (ONC) and its concentration in a given slurry, will generally and preferably be determined by trial-and-error, given below are examples of some, perhaps typical applications with the recommended ONC, to serve only as guideline, when practicing the invention:

1. Embodiments of slurries operating approximately at pH 5:
    preferred ONC candidate is m-nitro-benzene sulfonic acid, its sodium or ammonium salt, or mixtures thereof.
2. Embodiments of slurries operating at pH 5–9, approximately:
    Recommended ONC is same as in #1 above, but the slurry is likely to comprise a chelating agent to solubilize the metal salt formed. Such chelators can be, for example, hydroxy acids, hydroxy amino acids, and the like, designed to accomodate the given metal.
3. Embodiments of slurries operating at pH of about 8 or above:
    ONC is same as in #1 above, with the possible addition of m-nitro-benzoates as ONC candidate because it is soluble soluble at alkaline pH's. Here, chelating agents will be in the category of amines, ammonia, EDTA, Quadrol®, and the like. Quadrol is a trademark for N, N, $N^1$, $N^1$-tetrakis (2-hydroxypropyl) ethylene diamine.

The invention has been exemplified by the use of aromatic nitro compounds, mainly because of poor aq. solubility of aliphatic ONC's. Nevertheless, aliphatic ONC's may be applicable in aq. emulsion CMP compositions.

As to recommended concentrations of ONC, they will tend to be in the range of 1 g/l to 20 g/l or higher when used as sole oxidizing agent of the slurry of the invention, or can be 1–2 g/l or less when in the presence of additional oxidizing agents in the slurry.

The invention will be practiced using the basic components of prior art slurries, generally based on aqueous suspensions of abrasive particles, containing a variety of additives tailored for a given application. Also, the slurry will be dispensed between the polishing pad and the rotating wafer to be polished.

The invention claimed is:

1. A chemical mechanical polishing composition comprising abrasive particulate matter, an aliphatic organic nitro compound and a chelating agent selected from the group consisting of amines, ammonia, EDTA and N, N, $N^1$, $N^1$, tetrakis (2-hydroxy propyl) ethylene diamine, wherein said composition comprises an emulsion with a pH of about 8 or higher.

2. The composition of claim 1 wherein the concentration of the organic nitro compound is in the range of about 1 g/l to about 20 g/l.

* * * * *